United States Patent
Horng et al.

(10) Patent No.: US 6,806,112 B1
(45) Date of Patent: Oct. 19, 2004

(54) HIGH BRIGHTNESS LIGHT EMITTING DIODE

(75) Inventors: Ray-Hua Horng, Taichung (TW); Dong-Sing Wu, Taichung (TW); Yann-Jyh Chiang, Taichung (TW); Chi-Ying Chiu, Nan-Tou Hsien (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 10/668,554

(22) Filed: Sep. 22, 2003

(51) Int. Cl.[7] .............................................. H01L 21/00
(52) U.S. Cl. ............................ 438/29; 438/33; 438/39; 438/42; 438/458
(58) Field of Search ............................. 438/33, 29, 39, 438/42, 458, 956; 257/E33.068

(56) References Cited

U.S. PATENT DOCUMENTS

| | | | | |
|---|---|---|---|---|
| 5,869,849 A | * | 2/1999 | Jou et al. ....................... | 257/96 |
| 6,107,648 A | * | 8/2000 | Shakuda et al. ............ | 257/103 |
| 6,214,733 B1 | * | 4/2001 | Sickmiller ................... | 438/691 |
| 6,258,699 B1 | * | 7/2001 | Chang et al. ................ | 438/458 |
| 6,608,328 B2 | * | 8/2003 | Kuo et al. ..................... | 257/79 |
| 6,716,654 B2 | * | 4/2004 | Hsu et al. ..................... | 438/22 |
| 2003/0077847 A1 | * | 4/2003 | Yoo ............................. | 438/22 |

* cited by examiner

Primary Examiner—George Fourson
Assistant Examiner—Julio J. Maldonado
(74) Attorney, Agent, or Firm—Charles E. Baxley

(57) ABSTRACT

The present invention discloses a high brightness light emitting diode and a method for producing the same. The light emitting diode includes a gallium phosphide window and a reflective mirror so as to promote brightness thereof. To produce the light emitting diode, a glass substrate is bonded to the main structure of the light emitting diode and then the temporary substrate for epitaxing thereon can be removed for depositing a reflective mirror. After bonding a permanent substrate below the reflective mirror, the glass substrate is removed, too. By means of the double-bonding process, reflectivity of the mirror is maintained in the present invention.

10 Claims, 4 Drawing Sheets

HIGH BRIGHTNESS LIGHT EMITTING DIODE

BACKGROUND OF THE INVENTION

1. Field of the Invention

The present invention relates to a high brightness light emitting diode and a method for producing the same, in which gallium phosphide is provided as a window and more particularly, the bonding process are applied twice.

2. Related Prior Art

For manufacturing light emitting diodes, it's very important to promote brightness. Gallium phosphide (GaP) is a material with good electrical conductivity and high transparency in wavelength ranging from red to green, and therefore frequently applied to light emitting diodes (LEDs).

FIG. 8 shows a conventional LED structure including GaP. In this structure, a SiO2 layer 82, a reflective metal layer 83, a GaP layer 84, an active layer 85 and a gallium arsenide (GaAs) window 86 are sequentially presented on the silicon substrate 81. The electrodes 87, 88 are respectively formed on the GaAs window 86 and below the silicon substrate 81. The GaP material is provided here, but unfortunately doesn't contribute to brightness of the LED.

U.S. Pat. No. 5,869,849 provides another LED structure and method for producing the same, in which the GaAs substrate can be removed once a GaP layer is epitaxed on the active layer of aluminum gallium indium phosphide (AlGaInP). Next, the epitaxial structure is directly bonded to a GaP substrate, and two electrodes are respectively formed on the GaP epitaxial layer and below the GaP substrate. According to such a structure, the GaP window may theoretically enhance brightness of the LED. However, lattice alignment is difficult and bonding directly to the epitaxial layer at high temperature will seriously decrease production yield.

Therefore, it is necessary to find a method for producing LEDs with GaP windows, so that the above disadvantages can be meliorated.

SUMMARY OF THE INVENTION

The object of the present invention is to provide a high brightness light emitting diode (LED) and a method for producing the same, so that production yield can be promoted.

The method of the present invention includes steps of: a) providing a temporary substrate for epitaxing; b) sequentially epitaxing an n-type cladding layer, an active layer with quantum well structure and a p-type cladding layer on the temporary substrate; c) forming an p-GaP layer on the p-type cladding layer; d) forming a metal contact layer on the p-GaP layer; e) etching a part of the metal contact layer, the p-GaP layer, the p-type cladding layer and the active layer, and an upper part of the n-type cladding layer to expose the n-type cladding layer; f) forming a p-type ohmic contact electrode and an n-type ohmic contact electrode on the metal contact layer and the exposed n-type cladding layer to complete a main structure of the light emitting diode; g) bonding the surface with the electrodes of the main structure to a glass substrate; h) removing the temporary substrate; i) forming a reflective mirror on a bottom surface of the n-type cladding layer; j) bonding a permanent substrate to a bottom surface of the reflective mirror; and k) removing the glass substrate.

The temporary substrate used in the present invention is not restricted, for example, a GaAs substrate. The active layer can be made from III–V or II–VI compounds, for example, AlGaInP, gallium nitride (GaN) and zinc selenide (ZnSe).

The technology applied in step b) can be any appropriate deposit methods, wherein MOVPE is preferred. The glass substrate bonded to the main structure of the LED can be previously coated with proper adherent material such as epoxy or wax. The temporary substrate is usually removed by etching or chemical mechanical polishing.

The reflective mirror can be formed by plating a reflective material, for example, In, Sn, Al, Au, Pt, Pd, Zn, Ag, Ge, Ni, Au/Zn, Au/Be, Au/Ge, Au/Ge/Ni, or mixtures thereof, or composites of high dielectric/low dielectric or dielectric/metal.

The permanent substrate of the present invention can be a silicon substrate or a metal substrate with good heat dissipation. Between the permanent substrate and the reflective mirror, an adhesive layer is involved, which can be a pure metal or an alloy with a melting point below 350° C., or an organic adhesive with good heat dissipation and low operation temperature.

Between the metal contact layer and the p-type ohmic contact electrode, a transparent conductive film such as ITO (indium tin oxide) can be further added. Alternatively, the transparent conductive film can serve as the p-type ohmic contact electrode with a whole contact surface.

According to the above method, an LED composed of a GaP window and a reflective mirror with excellent reflectivity will be completed. Furthermore, brightness and yield of the LED of the present invention are promoted.

DETAILED DESCRIPTION OF THE PREFERRED EMBODIMENTS

Figure 1:
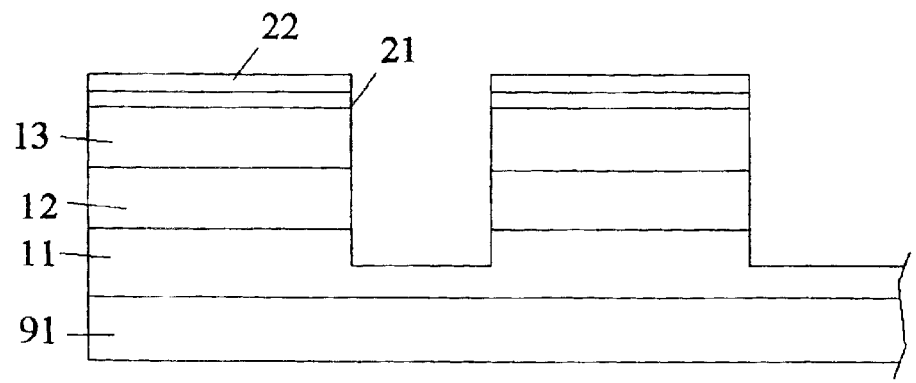
FIGS. 1–7 illustrate the processes for producing the LED of the present invention.

FIGS. 1–7 illustrate the processes for producing the LED of the present invention. First, on a GaAs temporary substrate 91, a multilayered structure sequentially including a first cladding layer 11 of n-AlGaInp, an active layer 12 of undoped AlGaInP, and a second cladding layer 13 of p-AlGaInP, is formed by MOVPE, as shown in FIG. 1.

In general, the active layer 12 can be formed by III–V or II–VI compounds with a pn (or np) junction and direct-bandgap. In this embodiment, undoped AlGaInP having wavelength ranging from 550 nm to 630 nm is used. AlGaInP can be expressed as $(Al_xGa_{1-x})_{0.5}In_{0.5}P$, wherein $0.5 \leq x \leq 1$ for both of the cladding layers 11, 13; and $0 \leq x \leq 0.45$ for the active layer 12.

On the second cladding layer 13, the thickness of transparent p-GaP layer 21 is about 0.2–60 µm thick. The GaP layer 21 has a bandgap larger than the LED epitaxial layer, and therefore exhibits good transparency at wavelength of red to green light. The GaP layer 21 also facilitates current spread due to better electrical conductivity than AlGaInP. Ordinarily, thickness of the GaP layer 21 is at least about 6% of the main LED structure, and preferably reached with vapor phase epitaxy. When applying the GaP window, brightness of the LED may be doubled or even tripled.

Next, on the GaP epitaxial layer 21, a metal contact layer 22 is formed for deposited a positive electrode. On the other hand, to expose the n-type cladding layer 11, a part of the metal contact layer 22, the p-GaP layer 21, the p-type cladding layer 13 and the active layer 12, and an upper part of the n-type cladding layer 11 are etched. As a result, trenches stopped at the n-type cladding layer 11 as shown in FIG. 1 can be formed.

In order to enhance electrical conductivity of the LED surface, metal contact layer 22 of GaAs is provided on the GaP layer 21, before sputtering a transparent conductive film 33 of ITO material.

Figure 2:
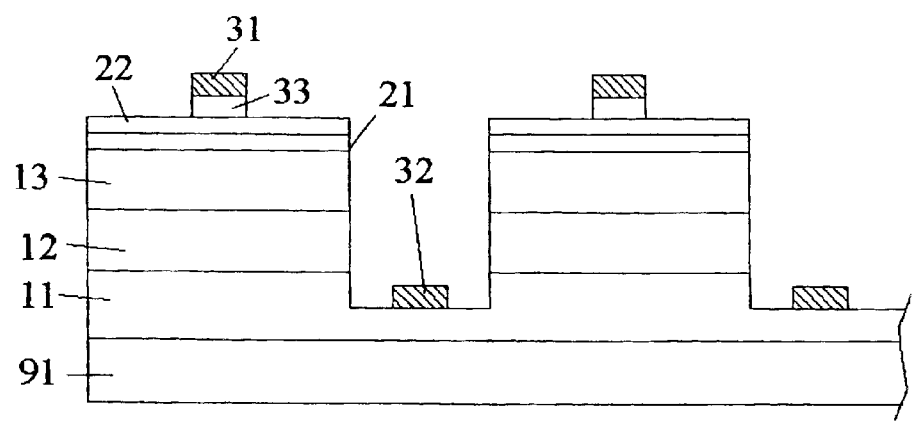

Now refer to FIG. 2, in which a p-type ohmic contact electrode 31 and an n-type ohmic contact electrode 32 are respectively deposited on the transparent conductive film 33 and the exposed n-type cladding layer 11 to complete the main structure of the LED. Alternatively, the transparent conductive film 33 can serve as the p-type ohmic contact electrode.

Figure 3:
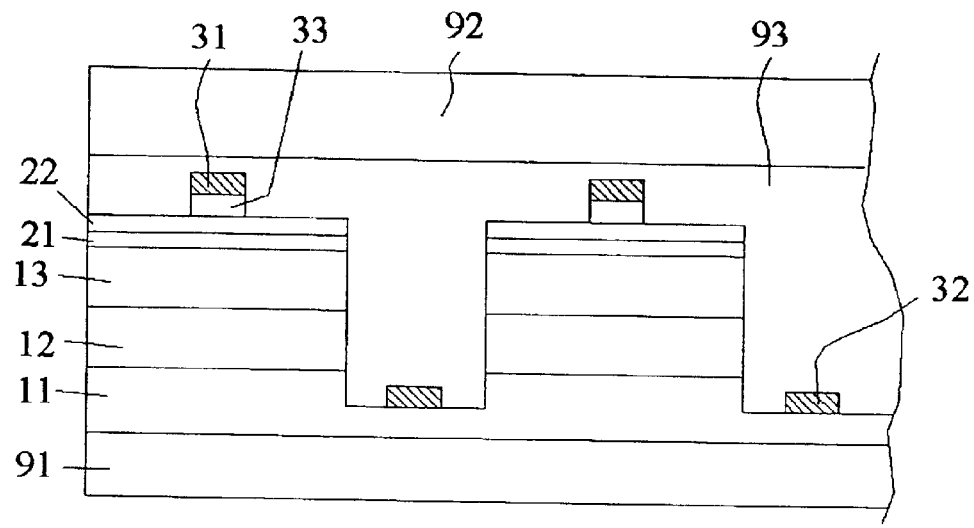
Figure 4:
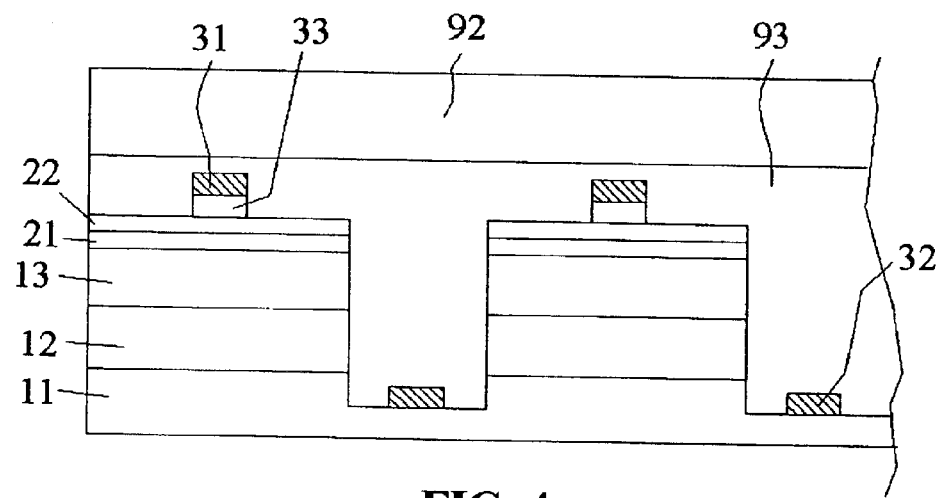

In FIG. 3, a glass substrate 92 coated with wax 93 is then bonded to an upper surface of the LED on which the electrodes 31, 32 are formed. The bonding process is carried out at 70–80° C. to make the wax 93 adherent. By supporting the LED with the glass substrate 92, the temporary substrate 91 is then removed by etching, as shown in FIG. 4.

Figure 5:
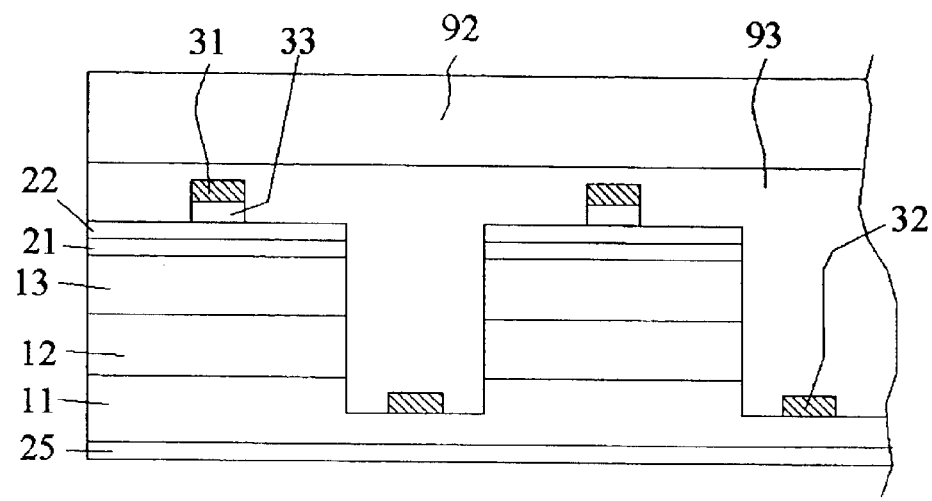

In order to further promote brightness of the LED, a reflective mirror 25 is coated on the bottom surface of the LED, so that light beams emitted from the active layer 12 can be directed toward the front direction, as shown in FIG. 5. The reflective mirror 25 can be made from In, Sn, Al, Au, Pt, Pd, Zn, Ag, Ge, Ni, Au/Zn, Au/Be, Au/Ge, Au/Ge/Ni, a composite of high dielectric and low dielectric, or a composite of dielectric and metal.

Figure 6:
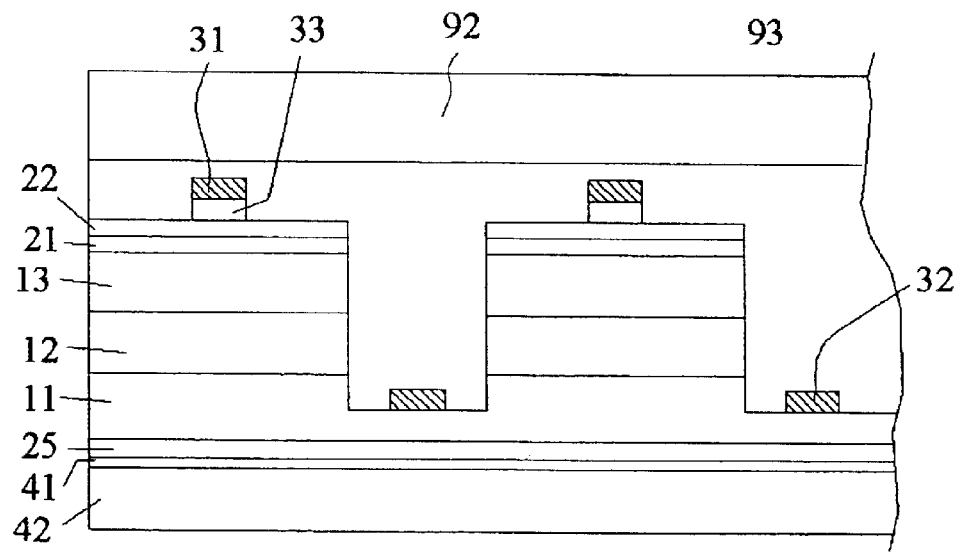
Figure 7:
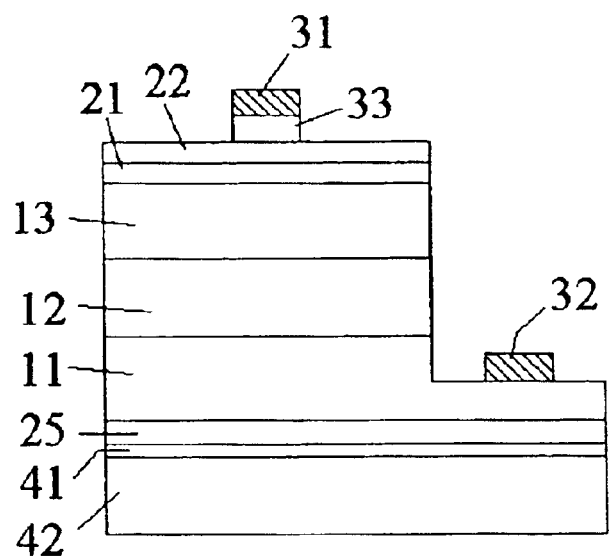
Figure 8:
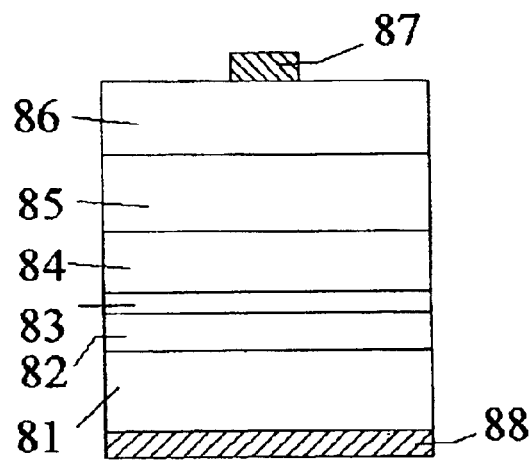
FIG. 8 shows the conventional LED structure.

Next, a permanent substrate 42 coated with an adhesive layer 41 is bonded to the bottom surface of the reflective mirror 25, as shown in FIG. 6. The permanent substrate 42 and the adhesive layer 41 are made from material with good heat dissipation, for example, silver epoxy and silicon, respectively. By supporting the LED with the permanent substrate 42, the glass substrate 92 is no more needed, and can be removed. As a result, the GaP epitaxial layer 21 is exposed as the main window. After dicing, an LED chip as shown in FIG. 7 is obtained.

By replacing the conventional GaAs window with the GaP window 21, brightness of the LED is apparently improved. Additionally, the reflective mirror 25 is coated after forming the electrodes 31, 32, which prevent the mirror 25 from damage at a high temperature. The present invention also provides a method more easily performed than the conventional by "bonding" the glass substrate 92 on the LED and "bonding" the permanent substrate 42 to the mirror 25. Since the above process is completed at a lower temperature, the present invention is also suitable for manufacturing large-sized LEDs.

What is claimed is:

1. A method for producing a high brightness light emitting diode, comprising steps of:
    a) providing a temporary substrate for epitaxing;
    b) sequentially epitaxing an n-type cladding layer, an active layer with quantum well structure and a p-type cladding layer on said temporary substrate;
    c) forming a p-GaP layer on said p-type cladding layer;
    d) forming a metal contact layer on said p-GaP layer;
    e) etching a part of said metal contact layer, said p-GaP layer, said p-type cladding layer and said active layer, and an upper part of said n-type cladding layer to expose said n-type cladding layer;
    f) forming a p-type ohmic contact electrode and an n-type ohmic contact electrode on said metal contact layer and said exposed n-type cladding layer to complete a main structure of said light emitting diode;
    g) bonding a glass substrate to an surface of said main structure on which with said electrodes are present;
    h) removing said temporary substrate;
    i) forming a reflective mirror on a bottom surface of said n-type cladding layer;
    j) bonding a permanent substrate to a bottom surface of said reflective mirror; and
    k) removing said glass substrate.

2. The method as claimed in claim 1, wherein said temporary substrate is a GaAs substrate.

3. The method as claimed in claim 1, wherein said active layer is made from AlGaInP.

4. The method as claimed in claim 1, wherein said reflective mirror is selected from the group consisting of In, Sn, Al, Au, Pt, Pd, Zn, Ag, Ge, Ni, Au/Zn, Au/Be, Au/Ge and Au/Ge/Ni, or mixtures thereof.

5. The method as claimed in claim 1, wherein said reflective mirror is a composite of high dielectric and low dielectric.

6. The method as claimed in claim 1, wherein said reflective mirror is a composite of dielectric and metal.

7. The method as claimed in claim 1, wherein said permanent substrate is bonded to the bottom surface of said reflective mirror by being previously coated an adhesive layer at a temperature below 350° C.

8. The method as claimed in claim 7, wherein said adhesive layer is a pure metal or an alloy with a melting point less than 350° C.

9. The method as claimed in claim 1, which further comprises a transparent conductive film between said metal contact layer and said p-type ohmic contact electrode.

10. The method as claimed in claim 1, wherein said p-type ohmic contact electrode is a transparent conductive film.

\* \* \* \* \*